United States Patent [19]

Yoshikawa

[11] Patent Number: 4,713,819
[45] Date of Patent: Dec. 15, 1987

[54] SEMICONDUCTOR LASER DRIVER

[75] Inventor: Shozi Yoshikawa, Tokyo, Japan

[73] Assignee: Olympus Optical Co., Ltd., Tokyo, Japan

[21] Appl. No.: 863,698

[22] Filed: May 15, 1986

[30] Foreign Application Priority Data

May 29, 1985 [JP] Japan .................... 60-115579

[51] Int. Cl.$^4$ ............................... H01S 3/10
[52] U.S. Cl. .......................... 372/9; 372/38; 372/33
[58] Field of Search .............. 372/9, 29, 38, 33, 34, 372/75, 36

[56] References Cited

U.S. PATENT DOCUMENTS

| 4,348,648 | 9/1982 | Childs | 372/33 |
| 4,479,221 | 10/1984 | Kitamura | 372/75 |
| 4,584,687 | 4/1986 | Howard | 372/29 |
| 4,604,753 | 8/1986 | Sawai | 372/36 |

FOREIGN PATENT DOCUMENTS

| 0004581 | 1/1979 | Japan | 372/29 |
| 0142987 | 11/1979 | Japan | 372/33 |
| 0140886 | 11/1979 | Japan | 372/29 |
| 0000985 | 1/1984 | Japan | 372/29 |

Primary Examiner—Leon Scott, Jr.
Attorney, Agent, or Firm—Frishauf, Holtz, Goodman & Woodward

[57] ABSTRACT

A laser beam emitted from a semiconductor laser is detected by a PIN type photodiode. A forward bias source or a reverse bias source is coupled to the photodiode through a switch. When a power source is turned on, the switch is switched to connect the forward bias source to the photodiode. A forward bias current is applied to the photodiode. At this time, a driver circuit has not yet been supplying a drive current to the semiconductor laser. With a forward bias current applied, a forward voltage drop is generated across the photodiode. A discrimination circuit compares the forward voltage drop to a reference voltage range. When the forward voltage drop is outside the range, it is determined that the photodiode is abnormal, and the driver circuit is controlled such that no drive current is supplied to the semiconductor laser. When the forward voltage drop is in the reference voltage range, the operation of the driver circuit is started, and the switch is switched to connect the reverse bias source to the photodiode. Therefore, the semiconductor laser is caused to effect intensity modulation oscillation according to an externally supplied modulation signal. The photodiode supplies a photoelectric conversion signal corresponding to the quantity of received light to an APC circuit, so that the output of the semiconductor laser is controlled for stabilization.

5 Claims, 7 Drawing Figures (BIAS CURRENT)

(OUTPUT OF
AMP 62)

(OUTPUT OF
OR GATE 64)

(LASER-ON
COMMAND 67)

(DISCRIMINATION
OUTPUT 61)

SEMICONDUCTOR LASER DRIVER

BACKGROUND OF THE INVENTION

This invention relates to a semiconductor laser device and, more particularly, to a semiconductor laser driver having an automatic light output stabilizer circuit, which detects the intensity of the laser beam, emitted from a semiconductor laser and controls the drive current to the semiconductor laser to maintain a constant laser beam intensity.

The semiconductor laser has a non-linear laser output characteristic with respect to the drive current (or drive voltage) and is susceptible to the influence of ambient temperature. To obtain a constant laser output, the semiconductor laser is driven by a driver having an automatic output stabilizer (hereinafter referred to as APC). A laser beam emitted from the back side of the semiconductor laser is detected by a PIN type photodiode. According to the quantity of detected light a closed loop feedback circuit is formed to maintain a constant semiconductor laser beam output intensity level.

However, when the photodiode itself is not operating properly, normal feedback control can not be obtained, and stabilization of the output beam intensity can not be obtained. Where the semiconductor laser is used for a pick-up of an optical recording/reproducing apparatus, accurate recording and reproduction of data can not be obtained.

Further, when normal feedback control can not be obtained, an excessive drive current flows through the semiconductor laser, and deterioration or rupture of the semiconductor laser is liable to result.

Further, since the semiconductor laser driver inclusive of the APC circuit is complicated in construction, even in case of operating difficulties due to mere deterioration or defectiveness of a photodiode, it takes time to, that is, trouble shoot the mean time to repair (MTTR) as an indicator of the reliability of the apparatus is extended.

SUMMARY OF THE INVENTION

An object of the invention is to provide a semiconductor laser driver, which has short MTTR and excellent reliability.

According to the invention, there is provided a semiconductor laser driver, which comprises an optical detector for photoelectrically converting a laser beam emitted from a semiconductor laser, a discrimination circuit for applying a forward bias to the optical detector and effecting a check as to whether the optical detector is operating normally depending on the output of the optical detector, and a controller for controlling the drive signal applied to the semiconductor laser according to the output of the optical detector, wherein the controller inhibits the operation of the semiconductor laser when the discrimination circuit determines that the optical detector is not normal.

DETAILED DESCRIPTION OF THE PREFERRED EMBODIMENT

Figure 1:
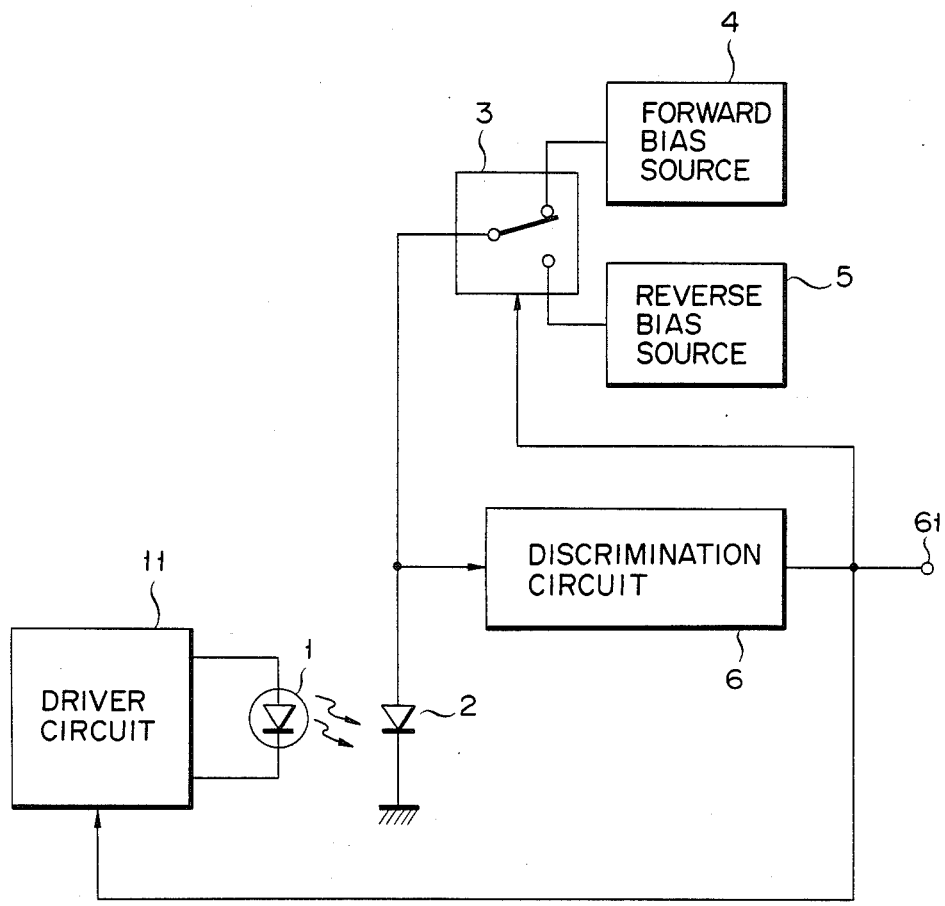
FIG. 1 is a block diagram showing a first embodiment of the semiconductor laser driver according to the invention.

An embodiment of a semiconductor laser driver according to the invention will be described with reference to the drawings. FIG. 1 is a block diagram showing the embodiment. Drive current to semiconductor laser 1 is controlled by driver circuit 11. A laser beam emitted from semiconductor laser 1 is detected by PIN type photodiode 2. Forward bias source 4 or reverse bias source 5 is connected through bias switch 3 to photodiode 2. Discrimination circuit 6 compares the voltage drop across photodiode 2 to a reference voltage to check whether or not photodiode 2 is normal. Output signal 61 of discrimination circuit 6 is fed to alarm device (not shown) and also to a control terminal of driver circuit 11 and a control terminal of bias switch 3. Although not shown, a photoelectric conversion signal from photodiode 2 is fed to an APC circuit, whereby semiconductor laser 1 is controlled to stabilize the output thereof.

The operation of the first embodiment will be described. When a power source is turned on, switch 3 is switched to connect forward bias source 4 to photodiode 2. Thus, a forward bias current is applied to photodiode 2. At this time, driver circuit 11 is not yet supplying a drive current to semiconductor laser 1. With the application of the forward bias current, a forward voltage drop is generated across photodiode 2. This forward voltage drop is 0.5 to 2.0 V when photodiode 2 is normal. Discrimination circuit 6 compares the forward voltage drop to the reference voltage range noted above. If the forward voltage drop is outside the range, circuit 6 judges that photodiode 2 is abnormal and provides "0" level signal as discrimination signal 61. When discrimination signal 61 of "0" level is generated, the operation of driver circuit 11 is inhibited, and an alarm device (not shown) generates an alarm, informing that photodiode 2 is abnormal. The inhibition of the operation of driver circuit 11 means that no drive current is supplied to semiconductor laser 1.

When the forward voltage drop across photodiode 2 is in the range of 0.5 to 2.0 V, discrimination circuit provides "1" level signal as discrimination signal 61. With a discrimination signal 61 of "1" level, the operation of driver circuit 11 is started to cause intensity modulation oscillation of semiconductor laser 1 according to an externally supplied modulation signal (not shown). Switch 3 is switched to connect reverse bias source 5 to photodiode 2. Photodiode 2 thus supplies a photoelectric conversion signal corresponding to the quantity of received light to the APC circuit (not shown). In this way, semiconductor laser 1 is controlled to stabilize the output thereof.

As has been shown, in the first embodiment both forward and reverse bias sources 4, 5 are provided for the photodiode 2, and before driving the semiconductor laser 1 a check is done as to whether or not the photodiode 2 is normal according to the forward voltage drop thereacross produced by application of the forward bias to the photodiode 2. When it is judged that the photodiode 2 is abnormal, the operation of the semiconductor laser 1 is inhibited. Thus, it is possible to eliminate the possibility that the stabilization of the semiconductor laser output by the APC circuit can not be obtained due to a problem with the photodiode itself. Also, it is possible to prevent damage to or rupture of the semiconductor laser due to an excessive drive current therethrough. Further, in case normal operation of the APC circuit can not be obtained due to a problem with the photodiode, the cause (i.e., trouble of the photodiode) can be instantly determined, thus reducing the mean time to repair (MTTR) and improving the reliability of the apparatus.

Figure 2:
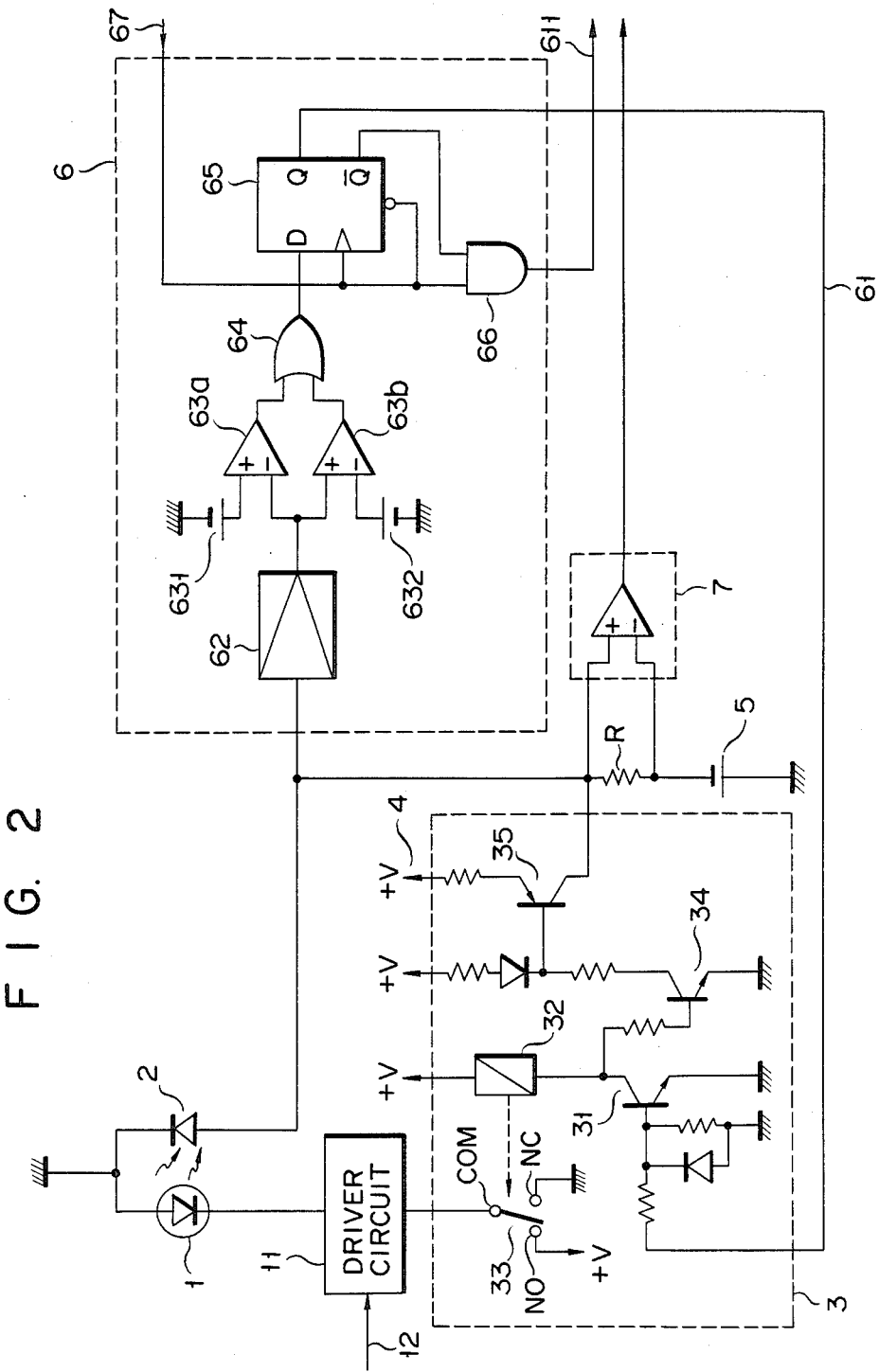
FIG. 2 is a circuit diagram showing a second embodiment of the semiconductor laser driver according to the invention.

FIG. 2 is a circuit diagram showing a second embodiment. In the Figure, parts like those in the first embodiment are designated by like reference numerals, and their detailed description is omitted. Bias voltage switching circuit 3 includes NPN transistors 31 and 34, PNP transistor 35, relay coil 32, relay switch 33 as well as resistors and level clamp diodes. Either voltage +V (forward bias source) or voltage from reverse bias source 5 is applied to photodiode 2 according to the on-off operation of PNP type transistor 35. Relay switch 33 couples either a +V voltage supply terminal or a ground terminal to driver circuit 11 according to on-off operation of relay coil 32. The connection of relay switch 33 to the ground terminal corresponds to the inhibition of operation of driver circuit 11.

Discrimination circuit 6 includes buffer amplifier 62, comparators 63a and 63b, power supplies 631 and 632 for supplying reference voltages to comparators 63a and 63b, OR gate 64, D-type flip-flop 65 and AND gate 66 which receives $\overline{Q}$ output of flip-flop 65 and a laser "on" command signal. The Q output of flip-flop 65 is supplied as discrimination signal 61 to the base of transistor 31 of bias voltage switching circuit 3. Discrimination signal 61 controls the switching of forward bias source (+V) and reverse bias source 5 coupled to photodiode 2 by controlling transistor 35 and switching between the voltage supply terminal (+V) and ground terminal connected to driver circuit 11 by controlling relay coil 32. The output signal of AND gate 66 is used as signal 611 for alarming that photodiode 2 is abnormal. A photoelectric conversion signal from photodiode 2 is fed through a monitor output circuit 7 to an APC circuit (not shown). Monitor output circuit 7 detects the voltage across the resistor R which is connected between PNP type transistor 35 and reverse bias source 5. Circuit 7 is comprised of, for example, a differential amplifier. To driver circuit 11 is supplied modulation signal 12 for causing modulation oscillation of semiconductor laser 1.

The operation of the second embodiment will now be described with reference to the signal waveform diagrams of FIGS. 3A to 3E. In FIGS. 3A to 3E, a solid line is obtained when photodiode 2 is normal. A broken line is obtained when there is an open-circuit failure of photodiode 2. A one dot-dashed line is obtained when there is a short-circuit failure of photodiode 2.

Figure 3A:
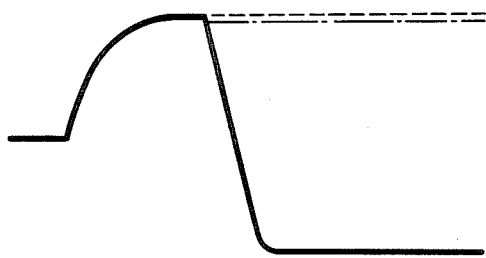
FIGS. 3A to 3E are signal waveform diagrams illustrating the operation of the second embodiment.
Figure 3B:
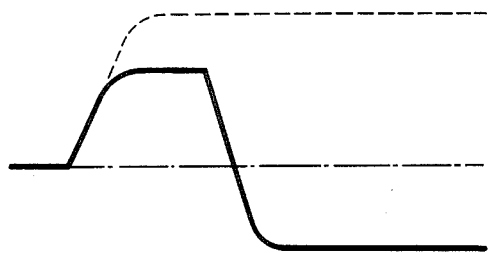

When the power source is turned on, the Q output of flip-flop 65 goes to "0" level, and discrimination signal 61 goes to "0" level. That is, the base bias voltage on transistor 31 goes to "0" level, and transistors 34 and 35 are turned on. As a result, photodiode 2 is forwardly biased through transistor 35 as shown in FIG. 3A. At this time, relay coil 32 is not energized, so that relay switch 33 connects the ground terminal NC to driver circuit 11 to inhibit the operation of driver circuit 11. The forward voltage drop across photodiode 2 is as high as 2 V or above when photodiode 2 is in an open-circuit failure, is in a range of 0.5 to 2 V when photodiode 2 is normal and is as low as 0.5 V or below when photodiode 2 is in a short-circuit failure. For this reason, the output voltage of buffer amplifier 62 is a high voltage when photodiode 2 is in an open-circuit failure, a low voltage when photodiode 2 is in a short-circuit failure and an intermediate voltage when photodiode 2 is normal, as shown in FIG. 3B.

Figure 3C:
Figure 3D:

Comparator 63a compares the output voltage of buffer amplifier 62 to reference voltage 631 (corresponding to 2 V), and it provides a "1" level signal when the output voltage of buffer amplifier 62 is lower than reference voltage 631. Comparator 63b compares the output voltage of buffer amplifier 62 to reference voltage 632 (corresponding to 0.5 V). When the output voltage of buffer amplifier 62 is above reference voltage 632, comparator 63b provides a "1" level signal. Therefore, OR gate 64 provides output of "1" level when photodiode 2 is normal, and provides "0" level when photodiode 2 is in an open-circuit or short-circuit failure, as shown in FIG. 3C.

Figure 3E:
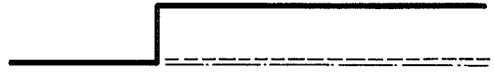

When laser "on" command signal 67 goes to "1" level (FIG. 3D), discrimination signal 61, which is the Q output of flip-flop 65, is at "1" level when photodiode 2 is normal and at "0" level when photodiode 2 is in an open-circuit or short-circuit failure, as shown in FIG. 3E. When discrimination signal 61 of "1" level is output (i.e., when photodiode 2 is normal), transistor 31 is turned on, and transistors 34 and 35 are turned off. As a result, photodiode 2 is reversely biased as shown in FIG. 3A. Relay coil 32 is thus energized, so that relay switch 35 is switched to connect the voltage supply terminal NO to driver circuit 11. The operation of driver circuit 11 is thus started to cause intensity modulation oscillation of laser 1 according to modulation signal 12. The reversely biased photodiode 2 monitors the output light quantity of semiconductor laser 1, and APC control is effected through monitor output circuit 7.

When discrimination signal 61 is at "0" level, on the other hand (i.e., when photodiode 2 is not normal), switch circuit 3 is not changed, that is, transistor 31 is kept "off" and transistors 34 and 35 are kept "on". Thus, photodiode 2 remains forwardly biased as shown in FIG. 3A, that is, driver circuit 11 remains connected to the ground terminal, and the operation of driver circuit 11 remains inhibited. At the same time, the $\overline{Q}$ output ("0" level output) of flip-flop 65 is output as monitor diode abnormal signal 611 through AND gate 66.

As has been shown, according to the second embodiment it is possible to provide a highly reliable semiconductor laser driver, which can check whether or not the photodiode is normal.

The above embodiments are by no means limitative and can be variously modified. For example, the photoelectric converter is not limited to the PIN type photodiode but may be replaced with a photodiode of a different type or other elements, such as CdS. When CdS is used as the photoelectric converter, it is not necessary to apply the forward bias voltage to check the converter itself. Since CdS has the same characteristic in response to the forward and reverse bias voltages, it is possible to apply the reverse bias voltage to CdS when checking the converter itself. Further, the discrimination circuit or bias switching circuit may be implemented software-wise using a CPU instead of constructing them with independent elements.

What is claimed is:

1. A discriminating device for determining a malfunction in a photodiode when the photodiode is connected in circuit, comprising:

circuit means for applying an operating potential of a first polarity to operating terminals of a photodiode to be tested;

test means for applying a test potential to said operating terminals of the photodiode, said test potential being of opposite polarity with respect to said operating potential; and means coupled to said circuit means and said test means for determining if said photodiode is malfunctioning according to a terminal voltage developed across the operating terminals of said photodiode when the test potential is applied, said determining means including means for producing a discrimination signal when said terminal voltage is within a predetermined range indicative of normal functioning of said photodiode.

2. A discriminating device according to claim 1, wherein said test means applies a forward bias potential to said operating terminals when said determining means is operated.

3. A semiconductor laser driver, comprising:
a semiconductor laser for emitting a laser beam in response to a driving signal;

optical detecting means for photoelectrically converting a part of the laser beam emitted from said semiconductor laser;

means for applying an operting potential to said optical detecting means to enable photoelectric conversion;

discriminating means for applying a test potential to said optical detecting means, and for determining if said optical detecting means is malfunctioning according to an output level of said optical detecting means when the test potential is applied, said discriminating means including means for producing a discrimination signal when said output level is within a predetermined range indicative of normal functioning of said optical detecting means; and controller means coupled to said discriminating means for producing said driving signal for driving said semiconductor laser according to the discrimination signal output from said discriminating means, said controller means inhibiting the operation of said semiconductor laser in the absence of said discrimination signal.

4. A semiconductor laser driver according to claim 3, wherein said discriminating means produces said discrimination signal when the output of said optical detecting means is within a predetermined voltage range, and produces a signal indicative that said optical detecting means is malfunctioning when said output is outside said predetermined voltage range.

5. A semiconductor laser driver according to claim 3, wherein said optical detecting means comprises a PIN type photodiode and said controller means comprises means for applying a forward bias and a reverse bias to said optical detecting means, said controller applying said forward bias when said discriminating means operated is and applying said reverse bias when it is determined that said optical detecting means is normal.

* * * * *